US012615970B2

(12) United States Patent
Jonnalagadda et al.

(10) Patent No.: US 12,615,970 B2
(45) Date of Patent: Apr. 28, 2026

(54) ULTRA-THIN PHASE-CHANGE MEMORY DEVICE WITH LATERAL ELECTRODE CONFIGURATION

(71) Applicant: INTERNATIONAL BUSINESS MACHINES CORPORATION, Armonk, NY (US)

(72) Inventors: Vara Sudananda Prasad Jonnalagadda, Wallisellen (CH); Ghazi Sarwat Syed, Kilchberg (CH); Timothy Mathew Philip, Albany, NY (US); Antonios Olziersky, Kilchberg (CH); Abu Sebastian, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 210 days.

(21) Appl. No.: 18/449,829

(22) Filed: Aug. 15, 2023

(65) Prior Publication Data

US 2025/0063958 A1     Feb. 20, 2025

(51) Int. Cl.
*H10N 70/00*        (2023.01)
*G11C 13/00*        (2006.01)
(Continued)

(52) U.S. Cl.
CPC ..... *H10N 70/8413* (2023.02); *G11C 13/0004* (2013.01); *G11C 13/0069* (2013.01);
(Continued)

(58) Field of Classification Search
CPC ............. H10N 70/8413; H10N 70/063; H10N 70/231; H10N 70/8828; H10N 70/011;
(Continued)

(56) References Cited

U.S. PATENT DOCUMENTS 11,232,824 B1 * 1/2022 Gong ................... G11C 11/2255
2007/0148855 A1 * 6/2007 Chen ................... H10N 70/8828
                                                      438/210

(Continued)

FOREIGN PATENT DOCUMENTS

KR    10-2022-0141435 A    10/2022
WO       2021/120620 A1     6/2021
WO       2022183951 A1      9/2022

OTHER PUBLICATIONS

Cheng, et al., "Phase Change Memory Cell With Heater", Application and Drawings, Filed on Oct. 18, 2022, 38 Pages, U.S. Appl. No. 18/047,290.

(Continued)

*Primary Examiner* — Jerome Leboeuf
(74) *Attorney, Agent, or Firm* — Samuel A. Waldbaum

(57)        ABSTRACT

The PCM cell includes a phase-change material layer (or PCM layer, for short), e.g., a layer including a germanium-antimony-tellurium alloy. The PCM layer has a top surface, a bottom surface, and a side surface linking the top surface and the bottom surface. The PCM cell further includes an outer electrode, which contacts the side surface of the PCM layer. That is, the outer electrode laterally caps the PCM layer. The PCM cell further includes a heater extending at least partially through the PCM layer, transversely to the top surface and the bottom surface of the PCM layer, to contact the PCM layer.

24 Claims, 7 Drawing Sheets

(51) Int. Cl.
*H10B 63/10* (2023.01)
*H10N 70/20* (2023.01)

(52) U.S. Cl.
CPC ........... *H10B 63/10* (2023.02); *H10N 70/063* (2023.02); *H10N 70/231* (2023.02); *H10N 70/8828* (2023.02)

(58) Field of Classification Search
CPC .............. H10N 70/826; G11C 13/0004; G11C 13/0069; H10B 63/10
See application file for complete search history.

(56) References Cited

U.S. PATENT DOCUMENTS

| | | | | |
|---|---|---|---|---|
| 2008/0048169 | A1* | 2/2008 | Doyle | H10N 70/231 |
| | | | | 257/209 |
| 2012/0282752 | A1 | 11/2012 | Lee | |
| 2021/0098532 | A1 | 4/2021 | Wu | |
| 2022/0254995 | A1 | 8/2022 | Han | |
| 2022/0352462 | A1 | 11/2022 | Wu | |
| 2024/0202514 | A1* | 6/2024 | Eshaghi | G02B 6/125 |

OTHER PUBLICATIONS

Close, et al., "Device, circuit and system-level analysis of noise in multi-bit phase-change memory", IEEE Xplore, Aug. 11, 2023, 4 pages.
Koelmans, et al., "Projected phase-change memory devices", Macmillan Publishers Limited, Nature Communications, Sep. 3, 2015, 7 pages.
Sarwat, Materials science and engineering of phase change random access memory, Materials Science and Technology, Taylor & Francis, vol. 33, No. 16, Jul. 18, 2017, 18 pages.
International Searching Authority, "Notification of Transmittal of the International Search Report and the Written Opinion of the International Searching Authority, or Declaration," Patent Cooperation Treaty, Oct. 25, 2024, 7 pages, International Application No. PCT/IB2024/056484.

* cited by examiner

S10: Provide phase-change memory devices

S20: Preliminary steps

S25: Select next IMC cell

S30: Apply RESET signal(s)

S40: Select subset of phase-change memory device(s)

S50: Apply SET signal(s)

S60: Read conductance values

ULTRA-THIN PHASE-CHANGE MEMORY DEVICE WITH LATERAL ELECTRODE CONFIGURATION

TECHNICAL FIELD

The invention relates in general to the field of phase-change memory (PCM) devices, as well as systems involving such PCM devices, methods of operating such a PCM device, and methods of fabricating PCM devices. In particular, it is directed to a PCM device including a phase-change material layer, an outer electrode, and a heater in a "punch-through" configuration: the phase-change material layer is laterally capped by the outer electrode, resulting in a doughnut-like shape of the phase-change material layer.

BACKGROUND

Resistive memory devices are gaining increasing attention, notably for multi-level data storage and in-memory computing hardware applications. Resistive memory devices notably include PCM devices, which can be switched reversely between several conductance states.

PCM devices can for instance be utilized for inference purposes in analog computing for artificial intelligence, using in-memory computing hardware. The memory elements can include phase-change memristive devices with tunable conductivities, high device resistance, and high retention, to minimize energy consumption. The tuning can be accomplished by forming different structural states with varying proportions of crystalline and amorphous phases of phase-change material.

PCM cells can have various configurations. A common PCM cell structure is the so-called 'mushroom' cell. The reason is that a phase-change material is confined between a top electrode and an insulating layer, itself bordered by a lower electrode. The latter contacts a heater passing through the insulating layer. The standard mushroom cell involves a large surface area electrode at the top of the phase change material and a much smaller heater at the bottom. Heating the phase-change material layer causes the amorphous phase to expand over the insulating layer in the form of a spherical cap, making it look (together with the heater) like a mushroom. Other designs involve a line cell in a lateral configuration. A further PCM cell design has been proposed, where the cell has a 'pancake' configuration: the top electrode only contacts a peripheral region of the top surface of a thin phase-change layer.

In general, PCM devices require a high-current RESET operation to switch the device from the low-resistance (crystalline) state to a high resistance (amorphous) state. Now, high currents hinder the scaling of technology. There is a need for low RESET currents, if only for power efficiency. Lower RESET currents are further needed to achieve smaller devices, improve the density of PCM cells, and for integration in the back end of line (BEOL).

SUMMARY

According to a first aspect, the invention is embodied as a phase-change memory (PCM) device. The device includes an electrically insulating material and a PCM cell, which is embedded in the electrically insulating material. The PCM cell includes a phase-change material layer (or PCM layer, for short), e.g., a layer including a germanium-antimony-tellurium alloy. The PCM layer has a top surface, a bottom surface, and a side surface linking the top surface and the bottom surface. The PCM cell further includes an outer electrode, which contacts the side surface of the PCM layer. That is, the outer electrode laterally caps the PCM layer. The PCM cell further includes a heater extending at least partially through the PCM layer, transversely to the top surface and the bottom surface of the PCM layer, so as to contact the PCM layer.

By definition, the heater extends inside the PCM cell, i.e., inside the outer electrode. As with pancake-type cells, the present PCM cell design makes it possible to achieve lower RESET currents than mushroom-type cells. However, here the phase change is radially triggered from within the PCM layer (e.g., from the center), because the heater extends through the PCM layer, at least partially. Moreover, the outer electrode laterally caps the PCM layer (i.e., it contacts the lateral side of the PCM layer), instead of tenting over the periphery of the top surface of the PCM layer. This saves considerable space, vertically, and accordingly results in shallower PCM devices, something that has benefits for back end of line integration. The benefits of the present approach are even more pronounced with respect to a mushroom-type cell, whether in terms of dimensions (and, thus, integration) or RESET currents.

The heater may only partially extend through the PCM layer, to minimize the contact area. Such a design option requires a more accurate control of the fabrication process of the heater. In variants, the heater extends fully through the PCM layer, which requires less control on the heater fabrication process. Still, the PCM layer can be made sufficiently thin to limit the contact interface with the heater.

In principle, the outer electrode may only partially cap the side surface of the PCM layer, laterally. In embodiments, however, the outer electrode fully caps the side surface of the PCM layer, laterally. This favors electrical contacts and improves performance, insofar as electrical currents applied to the heater can be more homogeneously dissipated through the outer electrode. In addition, such an electrode configuration is easier to fabricate and mitigates the risk for the PCM side walls to oxidize.

In embodiments, the heater extends essentially perpendicularly to each of the top surface and the bottom surface of the PCM layer. The longitudinal axis of the heater may even pass essentially through a center of the PCM layer. This results in a symmetric arrangement, which makes it possible to better distribute the region of the PCM layer that changes phases upon energizing the heater.

In embodiments, an average thickness of the PCM layer is smaller than an average diameter of a portion of the heater that extends through the PCM layer. In embodiments, the average diameter of said portion of the heater is of between 5 nm and 100 nm and more preferably between 5 nm and 40 nm. For instance, in embodiments, the average diameter of said portion of the heater is of between 30 nm and 40 nm, while the average thickness of the PCM layer is of between 1 nm and 20 nm. The average thickness of the PCM layer is more preferably less than 10 nm. The average diameter of the top surface and the bottom surface of the PCM layer is typically between 45 nm and 500 nm.

In embodiments, the PCM cell further includes a resistive projection liner, to lower the resistance drift and conductance fluctuations. The resistive projection liner contacts the PCM layer on its top surface or its bottom surface. The outer electrode fully caps, laterally, the side surface of the PCM layer and a side surface of the resistive projection liner. The heater extends through, and thereby contacts, each of the PCM layer and the resistive projection liner. The resistive projection liner may for instance include one of C, TiN, and TaN. More generally, the resistive projection liner may include a metal nitride, a metal oxide, a polysilicon, or a metal doped with silicon.

In embodiments, the PCM cell further includes an electrically insulating material layer and a protection layer on top of the electrically insulating material layer, the latter sandwiched between the protection layer and the top surface of the PCM layer. The outer electrode fully caps, laterally, the side surface of the PCM layer, as well as side surfaces of the protection layer and the electrically insulating material layer. The heater extends through, and thereby contacts, each of the protection layer, the electrically insulating material layer, and the PCM layer. The thickness of the full layer stack (i.e., including the protection layer, the electrically insulating material layer, the PCM layer, as well as the resistive liner, if any) will, in embodiments, not exceed 70 nm.

In embodiments, the outer electrode is structured to cap only a peripheral area of the top surface of the protection layer. This yields a safety rim, which makes sure that the outer electrode laterally covers the entire side surface of the protection layer, as well as all layers under it in the layer stack forming part of the PCM cell. The protection layer may for instance include hydrogen silsesquioxane.

In embodiments, the PCM device further includes a heater electrode contacting the heater and a circuit component contacting the heater electrode. This circuit component can for instance be a resistance or a selector, or an element thereof. The heater electrode and this circuit component extend on one side of the PCM layer and are embedded in the electrically insulating material.

In embodiments, the PCM device further includes two electrical contact pads, which respectively fill two vias extending through the electrically insulating material to respectively contact said circuit component and the outer electrode.

According to another aspect, the invention is embodied as a data processing system. The data processing system includes a control system and one or more PCM devices such as described above. I.e., the data processing system includes a PCM cell embedded in an electrically insulating material, wherein the PCM cell includes a PCM layer, an outer electrode contacting the side surface of the PCM layer, and a heater extending at least partially through the PCM layer, transversely to the top surface and the bottom surface of the PCM layer, so as to contact the PCM layer. Each PCM device is connected to the control system.

In some embodiments, the data processing system includes an in-memory computing (IMC) device, which has a crossbar array structure. The crossbar array structure includes N input lines and M output lines, which are interconnected at cross-points, so as to define N×M cells, where N≥2 and M≥2. The cross-points include respective memory systems, each including a group of K memory elements, where K≥1. That is, each of the N×M cells includes K memory elements, where each of the K memory elements includes one of the PCM devices. The control system includes a programming unit, which is connected to the crossbar array structure. The programming unit is configured to program each cell in accordance with a given a target conductance value corresponding to a target weight value to be stored in said each cell.

According to a further aspect, the invention is embodied as a method of operating a PCM device. The method first includes providing a PCM device as described above, i.e., a device including a PCM cell with a PCM layer embedded in an electrically insulating material, where a heater extends at least partially through the PCM layer, transversely, whereas an outer electrode contacts the side surface of the PCM layer, laterally. The method essentially revolves around repeatedly applying a RESET current pulse and a SET current pulse through the heater. The RESET current pulse causes to grow an annular amorphous region in the PCM layer, from the heater, which brings the PCM layer to a high-resistance state. Conversely, the SET current pulse causes to decrease the annular amorphous region in the PCM layer and accordingly brings the PCM layer to a low-resistance state. In typical applications, several PCM devices are concurrently operated, e.g., in a data processing system such as described above.

According to a final aspect, the invention is embodied as a method of fabricating a PCM device as described above. The method essentially includes fabricating a PCM cell by obtaining a stack of layers. The stack includes a PCM layer, having a top surface and a bottom surface linked by a side surface. An outer electrode layer is deposited on the stack, for the outer electrode layer to contact the side surface of the PCM layer and a top surface of the stack. A via is opened from the top surface of the stack. The resulting via extends at least partially through the PCM layer, transversely to the top surface and the bottom surface of the PCM layer. The via is then filled to obtain a heater that contacts the PCM layer. The PCM cell is eventually capped by an electrically insulating material to embed the PCM cell in the electrically insulating material. Note, the outer electrode layer may possibly be deposited after opening the via to obtain the heater.

In embodiments, the stack of layers obtained further includes a resistive projection liner, which contacts the PCM layer on its top surface or bottom surface. In that case, the via is opened to extend, at least partially, through each of the PCM layer and the resistive projection layer. That is, the heater as obtained by subsequently filling the via to contacts each of the resistive projection liner and the PCM layer.

In embodiments, the stack of layers obtained further includes an electrically insulating material layer and a protection layer on top of the electrically insulating material layer. The latter is sandwiched between the protection layer and the top surface of the PCM layer.

In embodiments, the method further includes, after filling the via and before capping the PCM cell, depositing a layer on top of the filled heater and patterning the deposited layer to obtain an electrode and a circuit component, which can be a resistance or a selector, or an element thereof.

In embodiments, the method further includes, after capping the PCM cell, etching further vias through the electrically insulating material and filling the further vias to obtain two electrical contact pads, which respectively contact the outer electrode and the circuit component.

BRIEF DESCRIPTION OF THE DRAWINGS

These and other objects, features and advantages of the present invention will become apparent from the following detailed description of illustrative embodiments thereof, which is to be read in connection with the accompanying drawings. The illustrations are for clarity in facilitating one skilled in the art in understanding the invention in conjunction with the detailed description. In the drawings.

Figure 1:
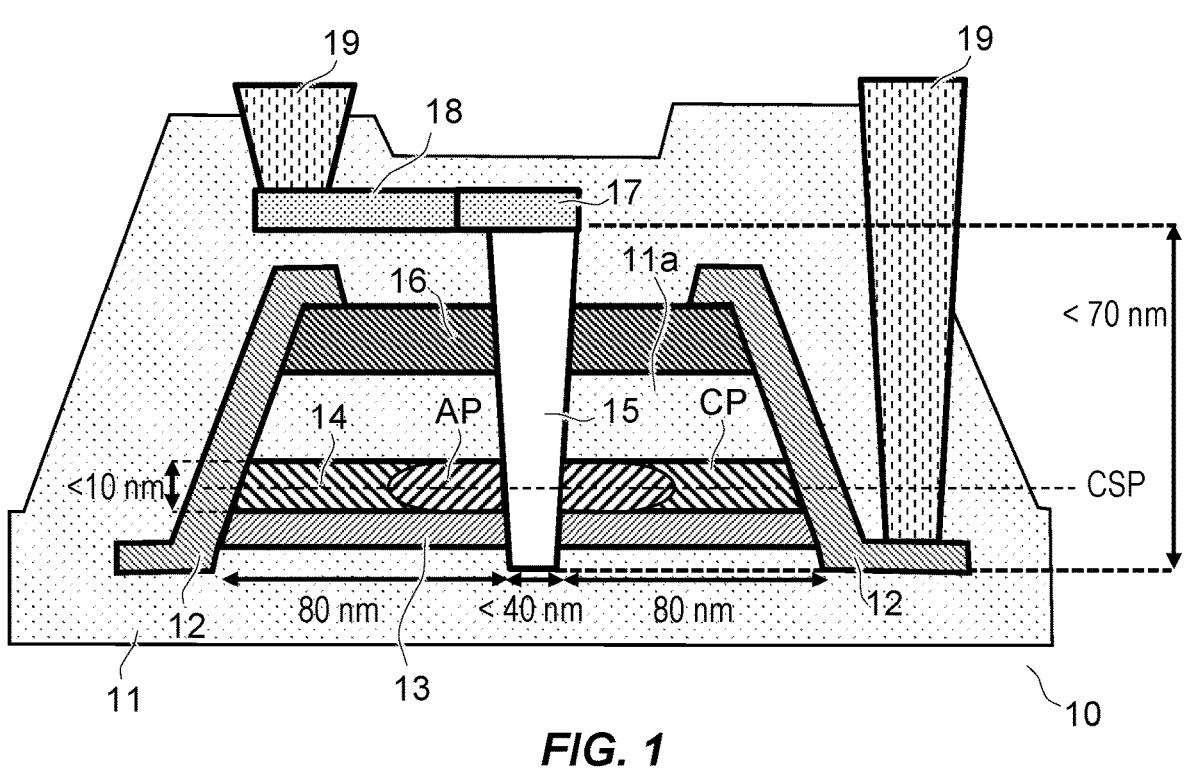
FIG. 1 is a 2D cross-sectional view of a phase-change memory (PCM) device, according to embodiments. The plane upon which the sectional view is taken includes the longitudinal axis of the heater.

The accompanying drawings show simplified representations of devices or parts thereof, as involved in embodiments. Technical features depicted in the drawings are not necessarily to scale. Similar or functionally similar elements in the figures have been allocated the same numeral references, unless otherwise indicated.

Devices, systems, and methods embodying the present invention will now be described, by way of non-limiting examples.

DETAILED DESCRIPTION OF EMBODIMENTS OF THE INVENTION

A first aspect of the invention is now described in detail, mostly in reference to FIGS. 1 to 4. This aspect concerns a phase-change memory (PCM) device 10, which includes an electrically insulating material 11 and a PCM cell 12-16, where the PCM cell is embedded in the electrically insulating material 11.

The PCM cell includes an outer electrode 12, a phase-change material layer 14, and a heater 15. In the following, the shorthand notation "PCM layer" is used to refer to the phase-change material layer 14, for convenience. The PCM layer 14 has a top surface (on top of layer 14 in FIG. 1), a bottom surface, and a side surface linking the top surface and the bottom surface. The PCM layer 14 may for instance have a cylindrical shape, i.e., be formed roughly as a right cylinder, as assumed in FIGS. 1 and 2. In that case, the top surface and the bottom surface correspond to the top base and the bottom base of the cylinder, respectively, and the side surface is the curved surface that joins the top and bottom bases of the cylinder.

The heater 15 extends at least partially through the PCM layer 14, transversely to the PCM layer 14, i.e., transversely to the top surface and the bottom surface of the PCM layer 14. That is, the heater has a "punch-through" configuration. The heater 15 is a heating element, which is normally connected by an electrode 17, e.g., on top of the heater 15 in FIG. 1. The heater contacts the PCM layer 14, mechanically, which ensures a close thermal communication between the heater 15 and the PCM layer 14. The heater can be regarded as an inner electrode, which, in the present context, extends at least partially through the PCM layer 14 and therefore contacts the inner edge surface of the PCM ring 14.

Conversely, the outer electrode 12 is an edge electrode, which laterally contacts the outer side surface (i.e., the outer edge surface) of the PCM layer 14. Preferably, the outer electrode 12 fully caps the outer side surface of the PCM layer 14, laterally as assumed in FIGS. 1-4. The outer electrode 12 is used to dissipate currents applied through the heater 15, in operation.

Figure 2:
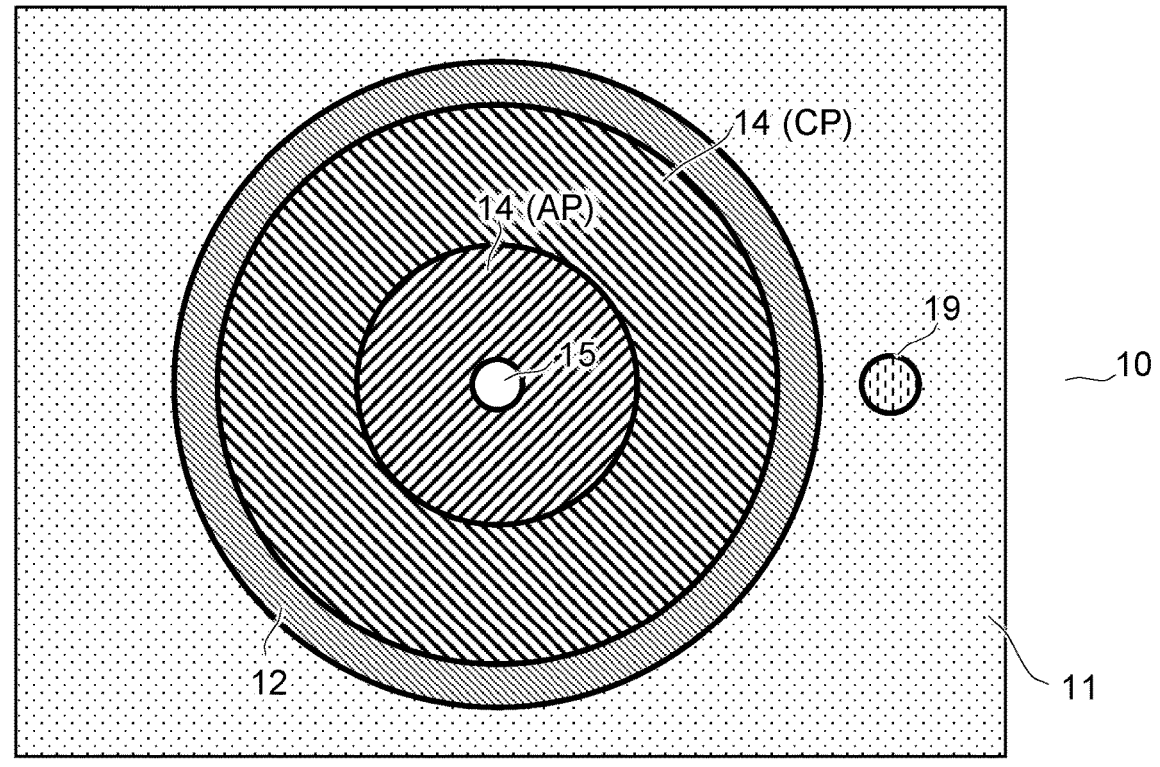
FIG. 2 is another cross-sectional view of the device of FIG. 1, taken in the mid plane of the phase-change material layer. In the example of FIGS. 1 and 2, the phase-change material layer is substantially cylindrical, and the layer stack roughly has rotational symmetry, as in embodiments.

The proposed design results in a lateral PCM configuration, which allows shallower PCM cells to be obtained. That is, this configuration gives rise to phase changes that are laterally triggered from the heater 15. I.e., the phase region changing phases (from crystalline to amorphous) grows radially from the heater 15, and typically forms an annulus (or doughnut) shape. This is illustrated in FIGS. 1 and 2; the plane upon which the transverse sectional view of FIG. 2 is taken is indicated by the broken line CSP in FIG. 1. This plane corresponds to the mid plane of the PCM layer 14. As seen in FIGS. 1 and 2, an amorphous-phase region AP grows radially from the heater 15 upon energizing the latter (i.e., upon applying a RESET current pulse), which causes to reduce the crystalline phase region CP. The resulting configuration of the amorphous phase can thus be referred to as a "doughnut" configuration.

As with pancake-type cells, the present PCM cell design makes it possible to achieve lower RESET currents than mushroom-type cells. The reason is that the phase change is laterally triggered from an inner area of the PCM layer (e.g., from the center). As a result, the annular portion of material that changes phases is more homogeneous, in operation. The proposed design actually resembles that of the so-called pancake-type cell and, incidentally, gives rise to similar SET/RESET resistances. However, there are two major differences with respect to the pancake-type cell. First, in the present case, the outer electrode 12 laterally caps the PCM layer (i.e., it contacts the lateral side of the PCM layer), instead of tenting over the periphery of the top surface of the PCM layer. This saves considerable space, vertically, and accordingly results in shallower PCM devices, something that has benefits for back end of line (BEOL) integration. Second, the phase change is radially triggered from within the PCM layer (e.g., from the center), because the heater extends through the PCM layer, at least partially.

The benefits of the present approach are even more pronounced with respect to a mushroom-type cell, whether in terms of dimensions (and, thus, integration) or RESET currents. One reason for the lower RESET current is that the outer electrode 12 and the heater 15 contact the PCM layer at lateral edges thereof. This effectively reduces the contact (or interface) areas between the heater and the PCM layers to $2\pi\, r_1\, h$ (for the heater 15) and $2\pi\, r_2\, h$ (for the outer electrode 12), instead of $\pi\, \rho_1{}^2$ (lower heater) and $\pi\, \rho_2{}^2$ (top electrode) in the mushroom cell. The quantities $r_1$ and $r_2$ correspond to the average inner hole radius (through which the heater 15 extends in the present case) and the average radius of the PCM layer 14, while $\rho_1$ and $\rho_2$ correspond to the average radii of the interface areas with the lower heater and the top electrode in the mushroom-type cell. Incidentally, in the present context, the contact area $2\pi\, r_1\, h$ between the heater 15 and the PCM layer can be further reduced if the heater does not fully extend through the PCM layer 14, as in embodiments.

Moreover, the fabrication of the present PCM cells is easier than the fabrication of mushroom cells. In particular, the PCM layer can be refined by chemical mechanical polishing/planarization (CMP). The fabrication of the heater is fairly simple, too, and may benefit from a self-alignment process, as discussed later in reference to another aspect of the invention.

All this is now described in detail, in reference to particular embodiments of the invention. To start with, the heater 15 may extend fully through the PCM layer 14, as illustrated in FIG. 1. That is, the heater 15 penetrates the PCM layer 14 from one side (e.g., from the top side of the top surface of the PCM layer 14 in FIG. 1) and reaches to the other side (the bottom surface of layer 14). It may even slightly protrude from the bottom side, i.e., pass through the PCM layer, as assumed in FIG. 1. In that case, the PCM layer has a ring-like or doughnut-like shape. Such a design requires less control on the etch stop, inasmuch as the heater via can be fully etched through the PCM layer 14.

Figure 5A:
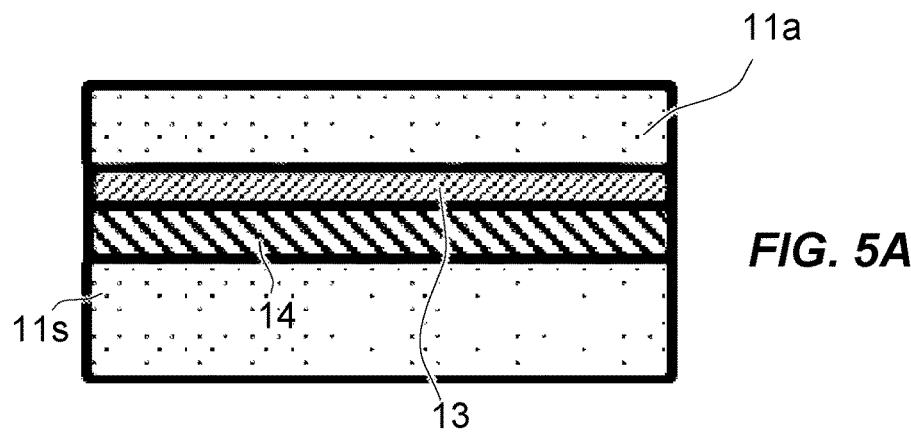
FIGS. 5A, 5B, 5C, 5D, 5E, 5F, 5G, 5H and 5I are a sequence of cross-sectional views (in the plane containing the longitudinal axis of the heater, as in FIG. 1) illustrating high-level fabrication steps of a PCM device similar to that of FIG. 1, except that the resistive projection liner is now above the phase-change material layer and the heater extends only partially through the phase-change material layer, according to embodiments.
Figure 5B:
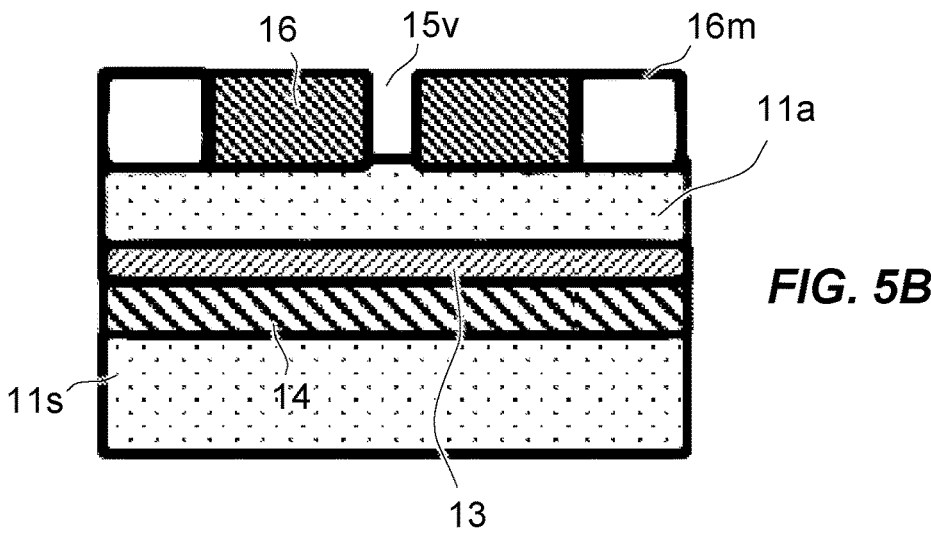
Figure 5C:
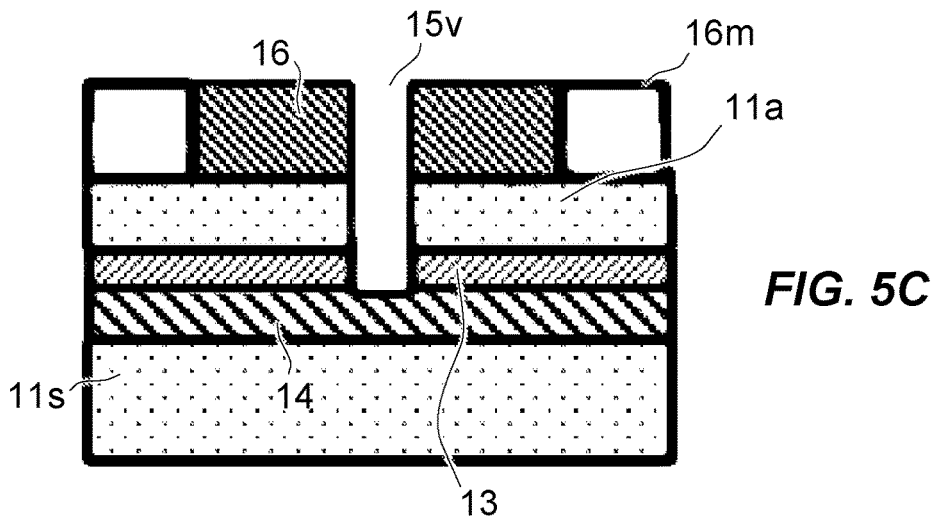
Figure 5D:
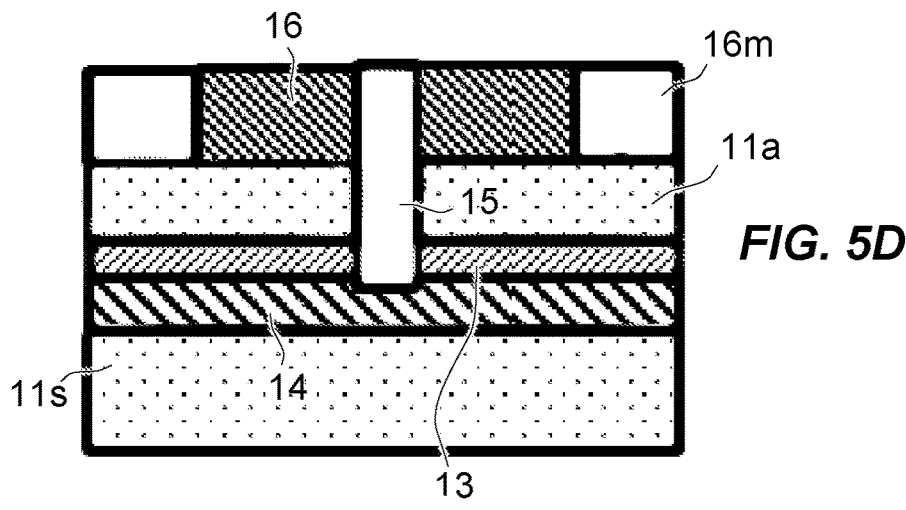
Figure 5E:
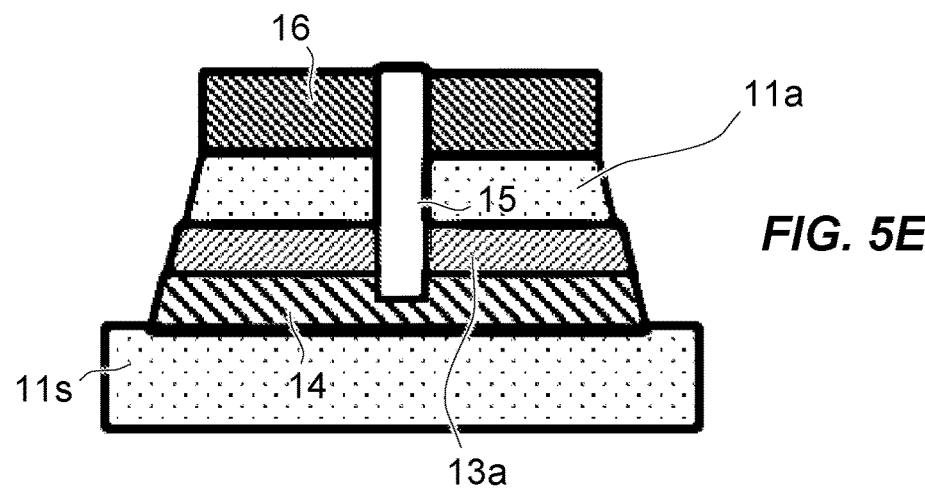
Figure 5F:
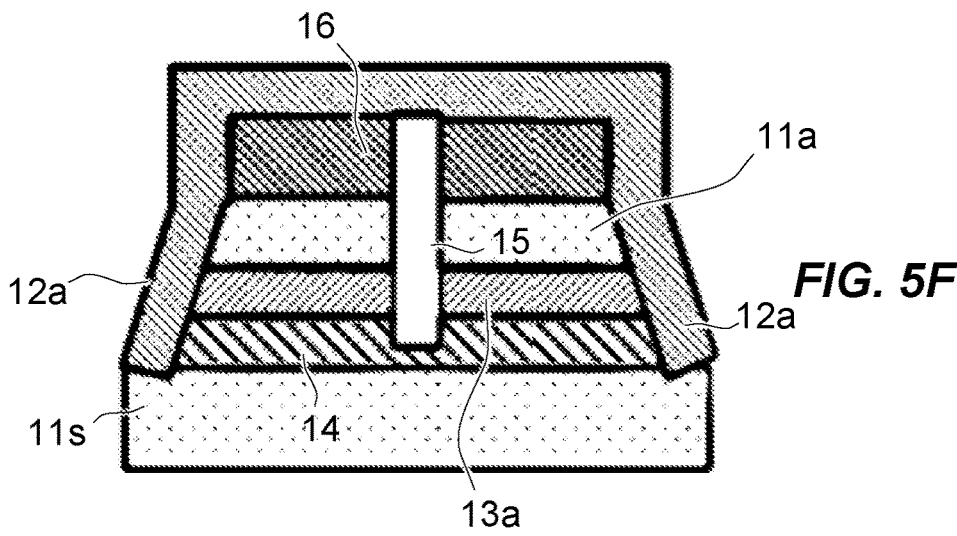
Figure 5G:
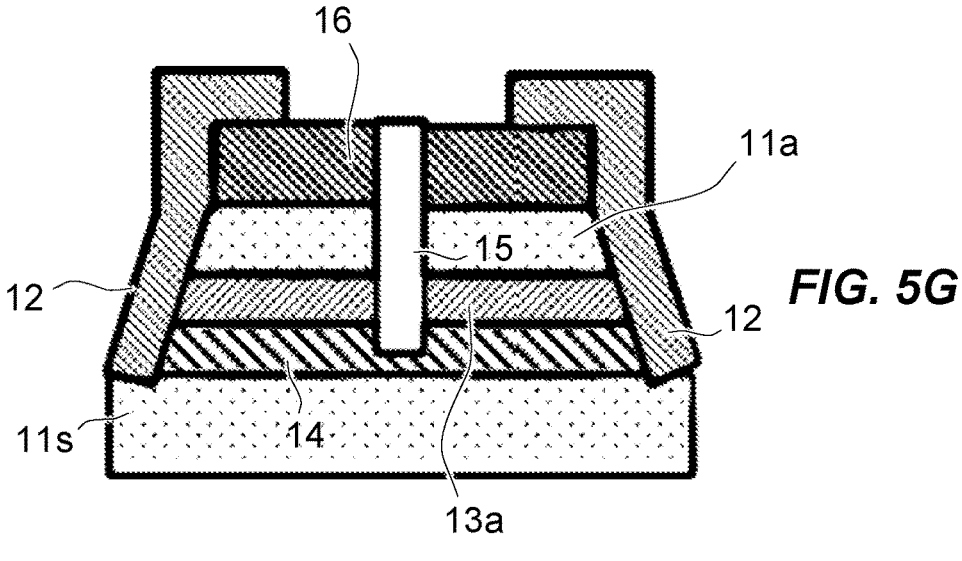
Figure 5H:
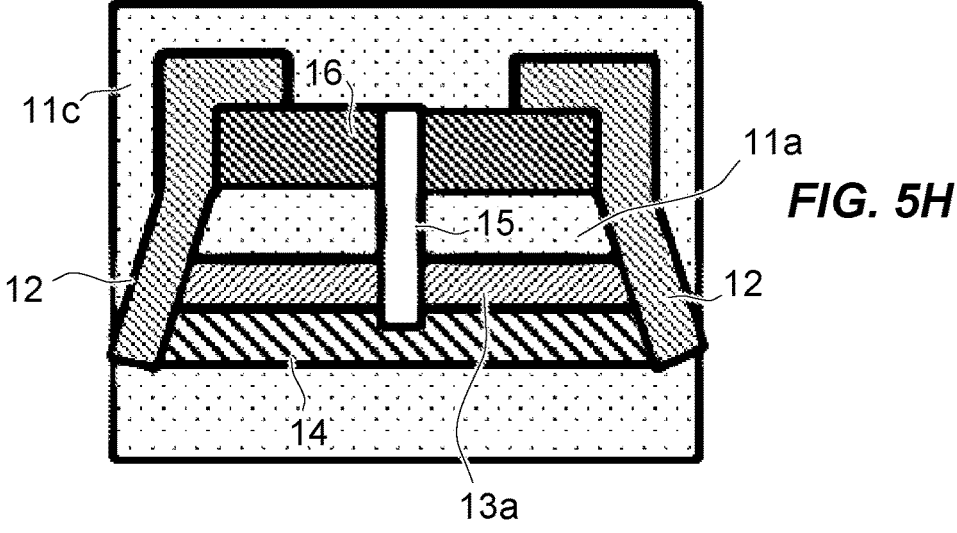
Figure 5I:
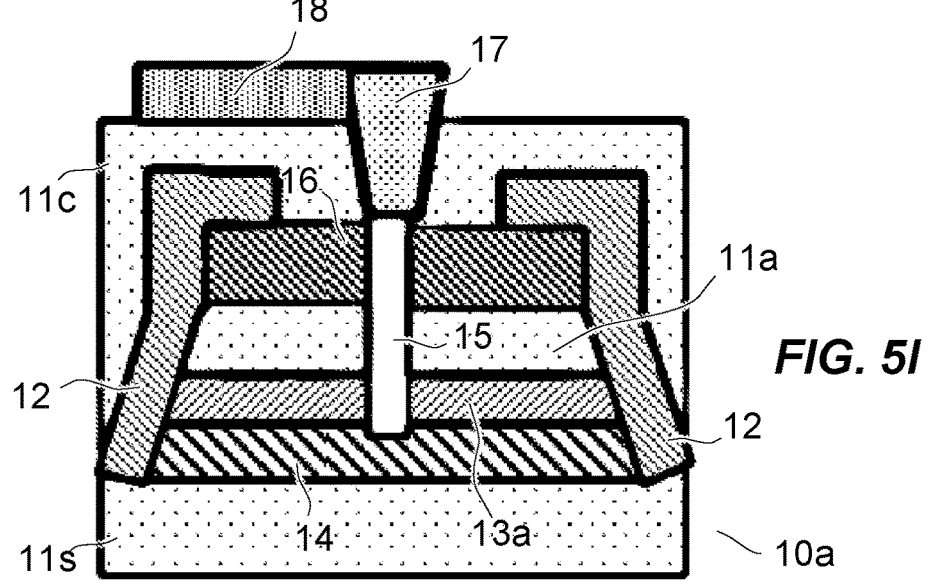

In variants, see, e.g., FIG. 5I, the heater 15a extends only partially through the PCM layer 14. Such a design option requires a more accurate control of the etch stop. However, it also makes it possible to further minimize the electrical contact area between the heater 15 and the PCM layer 14. In turn, the PCM layer 14 can be made somewhat thicker. I.e., a more precise fabrication process of the heater makes it possible to relax constraints as to the PCM layer thickness. That said, even if the heater 15 fully passes through the PCM layer 14 (as in FIG. 1), the latter can still be made sufficiently thin to moderate the electrical interface area.

In principle, the outer electrode 12 may only partially caps the outer side surface of the PCM layer 14, laterally. In embodiments, though, the outer electrode 12 fully caps the side surface of the PCM layer 14, laterally, as assumed in FIGS. 1-3. This favors electrical contacts and improves performance, insofar as electrical currents applied to the heater 15 can be more homogeneously dissipated through the outer electrode 12. In addition, such an electrode configuration mitigates the risk for the PCM side walls to oxidize and is easier to fabricate since this gives rise to a more symmetric arrangement.

Figure 3:
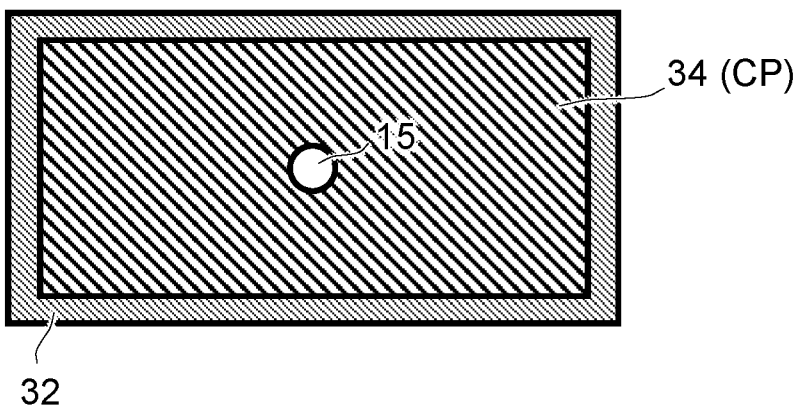
FIGS. 3 and 4 are cross-sectional views illustrating variants to FIGS. 1 and 2, in which the layer stack has a tetragonal or pyramidal shape, extending from a phase-change material layer that has a rectangular (FIG. 3) or square (FIG. 4) shape, as in embodiments.
Figure 4:
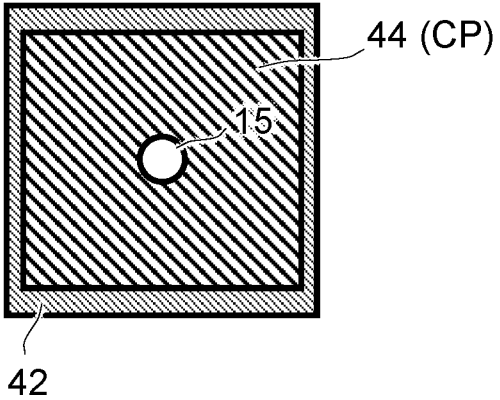

While the longitudinal axis of the heater 15 generally extends in a direction transverse to the PCM layer 14, this direction is, in embodiments, perpendicular (or essentially perpendicular) to the PCM layer. In particular, the heater 15 can be made roughly symmetrical around its longitudinal axis (it has rotation symmetry) and this axis may ideally pass through the center of the PCM layer. Thus, in embodiments, the heater 15 extends essentially perpendicularly to each of the top surface and the bottom surface of the PCM layer 14, and the longitudinal axis of the heater 15 passes essentially through the center of the PCM layer 14. For example, the PCM layer 14 may have a shape that is essentially cylindrical, and the longitudinal axis of the heater 15 may essentially coincide with the cylindrical axis of the PCM layer. In this example, the PCM layer 14 can be regarded as a shallow right cylinder. In variants, the PCM layer 34, 44 may have a square or rectangular shape (and so will the outer electrode 32, 42), for example, as illustrated in FIGS. 3 and 4.

Having the heater passing through the center of the PCM layer 14 results in a more symmetric arrangement, which makes it possible to better distribute the region of the PCM layer 14 that changes phases upon energizing the heater 15. Fairly symmetric arrangements as disclosed above can notably be achieved using a self-alignment fabrication process of the heater, as discussed later in respect of another aspect of the invention.

When using other, more conventional fabrication process, the heater 15 may be slightly off centered. For example, for a disk size of 200 nm outer diameter, a misalignment of between 10 to 20 nm is expected for the heater 15. This may impact the inter-device variability, in terms of resistance value of the full RESET state and threshold voltage. For the shorter leg, the full RESET state will effectively provide a parallel path for the current flow. This means that the resistance value will be capped and not change even when larger amorphous volumes are formed on the longer leg. However, this may not systematically be a problem. Indeed, it is not necessarily required to exploit full RESET states, because they can be very resistive and thus yield very weak currents. Furthermore, when the device is projected with a liner 13, as in embodiments, the achievable resistance value will anyway be capped. Moreover, because the threshold voltages scale linearly with the amorphous volume size, they would reduce at the smaller leg. For completeness, the electric field (and the current profile) may increase towards the side that has a smaller spacing due to misalignment, but the heat flux should remain relatively stable since the heater 15 is the main heat sink.

In embodiments, the average thickness of the PCM layer 14 is smaller than an average diameter of a portion of the heater 15 that extends through the PCM layer 14. Reducing the thickness of the PCM layer and the heater size both result in reducing the device reset current. The heater may be slightly tapered, as illustrated in FIG. 1. The average diameter of the heater portion that penetrates the PCM layer is, in embodiments, y between 5 nm and 100 nm. For example, this average diameter can be between 30 nm and 40 nm, while the average thickness of the PCM layer 14 is between 1 nm and 20 nm. Note, a very thin (e.g., 1 nm) PCM layer can be achieved using atomic layer deposition (ALD), while layers 2 nm or more can be obtained through physical vapor deposition (PVD), as in some embodiments. In comparison, the average diameter of the PCM layer (and so the average diameter of the top and bottom surfaces of the PCM layer) will typically be between 45 nm and 400, or even 500 nm. For example, the average PCM disk diameter assumed in FIG. 1 is approximately equal to, though slightly less than, 200 nm, while the average thickness of the PCM layer is less than 10 nm. The average diameter of the PCM layer 14 is measured in-plane, e.g., in the top or bottom surface of the PCM layer 14, while the thickness is measured perpendicularly to the mean plane of the PCM layer, i.e., along the stacking direction.

In embodiments, the PCM cell 12-16 further includes a resistive projection liner 13 (also referred to as a "liner" in this document), to lower the resistance drift and conductance fluctuations. In principle, the liner 13 may contact the PCM layer 14 on its top surface or bottom surface. For example, in FIG. 1, the liner extends below the PCM layer 14, whereas it extends above the PCM layer 14 in the layer stack shown in FIGS. 5A-5I. The thickness of the liner 13 will typically be between 1 and 20 nm; it is, in embodiments, slightly thicker than the PCM layer 14, notwithstanding the apparent proportions in the accompanying drawings. Note, where a liner 13 is present, the outer electrode 12 laterally caps the side surfaces of both the PCM layer 14 and the liner 13, because the outer electrode laterally caps the full layer stack. In addition, the heater 15 extends through (and thereby contacts) each of the PCM layer 14 and the liner 13. More precisely, the heater 15 contacts each of the PCM layer 14 and the liner 13 along a via opened in the thicknesses of the PCM layer 14 and the liner 13.

The liner 13 is subject to certain design rules, for the projection mechanism to work. Such rules exploit the highly nonlinear field-dependent electrical transport properties of phase change materials. A minima, the resistance of the projection component must fulfil the following conditions: (i) The resistance of the amorphous part (in the ON-state) of the PCM layer 14 must be (much) higher than the resistance of the liner 13 projection component; (ii) The resistance of the crystalline part of the PCM layer 14 must be much lower than that of the liner 13; and (iii) the resistance of the amorphous part must be much lower than that of the liner 13.

As further seen in FIG. 1, the PCM cell 12-16 typically includes an electrically insulating material layer 11*a*, as well as a protection layer 16 on top of the electrically insulating material layer 11*a*. The layer 11*a* is thus sandwiched between the protection layer 16 and the top surface of the PCM layer 14. Again, the outer electrode 12 fully caps, laterally, the side surfaces of the full stack, i.e., the liner 13 (if any), the PCM layer 14, the electrically insulating material layer 11*a*, and the protection layer 16.

Interestingly, the outer electrode 12 may be structured to cap only a peripheral area of the top surface of the protection layer 16, as illustrated in FIGS. 1 and 5A-5I. I. e., the outer electrode 12 draws a safety rim on top of the protection layer 16. Such a structural feature results from the patterning of the outer electrode 12, see FIG. 5G, to provide a passage for the electrode 17 contacting the heater 15. This safety rim is retained to make sure that the outer electrode 12 laterally covers the entire side surface of the protection layer 16. For completeness, the heater 15 extends through (and thereby contacts) each layer 13, 14, 11*a*, 16 of the PCM cell stack.

As evoked above, the PCM device 10 may further include a heater electrode 17 contacting the heater 15, as well as a circuit component 18 contacting the heater electrode 17. The circuit component 18 may for instance be a resistance (as assumed in the accompanying drawings) or a selector. The component 18 may in fact only be a part of the selector or the resistance. The heater electrode 17 and this circuit component 18 extend on one side of the PCM layer 14 (i.e., on top of the PCM layer 14 in the accompanying drawings) and are embedded in the electrically insulating material 11.

For completeness, the PCM device 10 may further include two electrical contact pads 19, which respectively contact the circuit component 18 and the outer electrode 12. As seen in FIG. 1, the two electrical contact pads 19 respectively fill two vias, which extend through the electrically insulating material 11, down to the respective elements, i.e., the outer electrode 12 and the component 18. As further seen in FIG. 1, the outer electrode 12 may for instance include a neck flange, i.e., a protruded lip, which can be contacted by the right-hand side contact pad 19.

The PCM layer 14 may include, or even consists of, a germanium-antimony-tellurium alloy (noted GeSbTe, or GST for short), in embodiments, doped. In variants, the PCM layer 14 includes, or consists of, an alloy including Ge, Sb, and Te, as well as one or more additional elements, such as Se. Other dopants can be used, including $SiO_2$, $O_2$, Ti, and Cu. The PCM layer may for instance include $Ge_2Sb_2Te5$ or $Ge_2Sb_2Se_4Te$. Other possible suitable PCM materials may for instance be VOx, NbOx, GeTe, GeSb, GaSb, AgInSbTe, InSb, InSbTe, InSe, SbTe, TeGeSbS, AgSbSe, SbSe, GeSbMnSn, AgSbTe, AuSbTe, and AlSb.

Suitable materials for the resistive projection liner 13 include carbon (C), a metal nitride, such as titanium nitride (TiN) and tantalum nitride (TaN). Other materials can be contemplated, such as metal oxides, polysilicon, or metals doped with silicon. The electrically insulating material layer 11*a* will typically be of the same material as the insulating matrix 11, although this is not a strict requirement. In principle, such electrically insulating materials 11, 11*a* can be electric insulators or dielectric materials. Suitable materials include $SiO_2$ and $Si_3N_4$, although other oxides or nitrides can be contemplated, such as $Al_2O_3$ or $HfO_x$. The protection layer 16 typically includes hydrogen silsesquioxane (HSQ). An HSQ film can typically be obtained with a thickness of between 0.01 to 2 μm. In variants, the protection layer may be a spacer material, as discussed later in detail.

FIGS. 1 and 5I show two embodiments of a PCM device 10, 10*a*. In each case, the device 10, 10*a* includes a PCM cell embedded in a dielectric material 11, 11*s*, 11*c*. The PCM cell includes a layer stack involving a PCM layer 14, a resistive projection liner 13, 13*a* coating the PCM layer 14 on its top or bottom surface, a dielectric layer 11*a* on top of the PCM layer 14, and a protection layer 16 on top of the dielectric layer 11*a*. The outer electrode 12 laterally caps the layer stack side surface of the PCM layer (14) and forms a peripheral rim on top of the protection layer 16. The heater 15 extends through the protection layer 16, the dielectric layer 11*a*, the resistive projection liner 13, 13*a*, and at least partially through the PCM layer 14. The heater extends perpendicularly to the layers of the stack, i.e., along the stacking direction. When the resistive projection liner 13 is below the PCM layer 14 (as in FIG. 1), the heater 15 extends fully through the PCM layer 14, whereas it may only extend partially through the PCM layer 14 when the liner 13*a* is on top of the latter (FIG. 5I). Contact pads are formed through the embedding material 11, 11*c*, to contact the outer electrode 12 and the heater 15.

Figure 6:
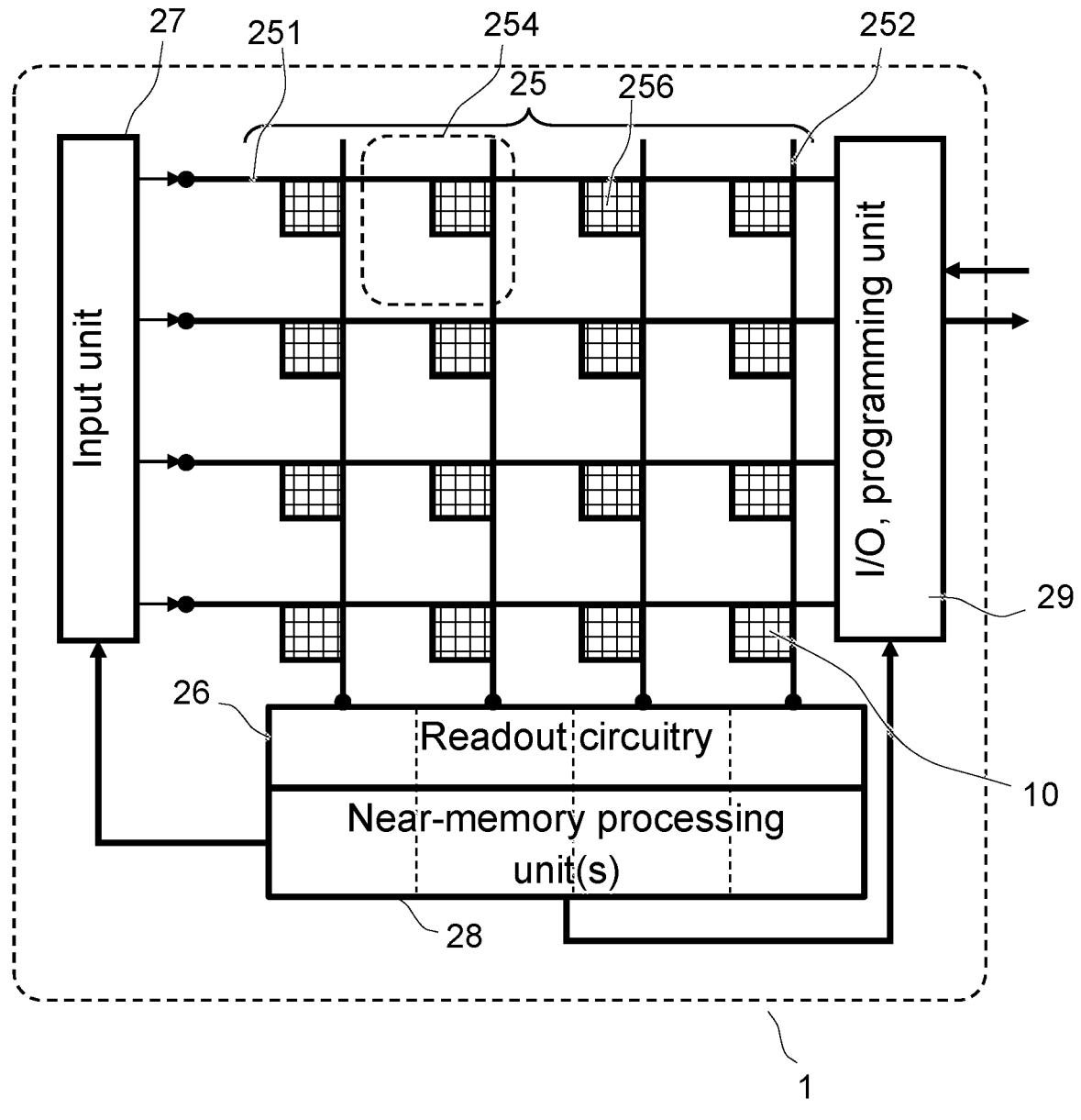
FIG. 6 is a diagram of a data processing system containing an in-memory compute unit, the memory elements of which include PCM devices such as depicted in FIGS. 1, 2, and 5I, according to embodiments.

Referring to FIG. 6, another aspect of the invention concerns a data processing system 1 (or simply "system", for short), which includes one or more PCM devices 10 such as described above. The system 1 typically includes several PCM devices 10, as assumed in the following. The system 1 further includes a control system 26-29, to which the PCM devices 10 are connected. The data processing system 1 may notably be an information processing system or a memory system.

In some embodiments, the data processing system 1 includes an in-memory compute (IMC) device 25-29, which can notably be used to perform matrix operations such as matrix-vector multiplications (MVMs). Such operations are notably useful to perform inferences based on artificial neural networks (ANNs) and decision trees. In this context, MVM operations pose multiple challenges, because of their recurrence, as well as compute and memory requirements. Traditional computer architectures are based on the von Neumann computing concept, according to which processing capability and data storage are split into separate physical units. This architectural concept suffers from congestion and high-power consumption, as data must be continuously transferred from the memory units to the control and arithmetic units through interfaces that are physically constrained and costly.

One possibility to accelerate MVMs is to use dedicated hardware acceleration devices, such as IMC devices having a crossbar array structure. Such an architecture can simply and efficiently map MVMs: Vectors are encoded in signals, which are applied to the input lines of the crossbar array to perform the MVMs as multiply-accumulate (MAC) operations. The weights can be updated by reprogramming the memory elements, as needed to perform the successive MVMs. Such in-memory computing devices break the "memory wall" as they fuse the arithmetic- and memory unit into a single in-memory-computing (IMC) unit. What is more, using analog memory devices in an IMC unit allows MVM operations to be efficiently performed, by exploiting analog storage capability of the IMC device and Kirchhoff's circuits laws. Another advantage of crossbar array structures is that they support transposed matrix operations, something that can be exploited to train ANNs. More generally, the key compute primitive enabled by such devices can also be used for other applications, e.g., solvers for systems of linear equations.

As seen in FIG. 6, the IMC device has a crossbar array structure 25. That is, the IMC device 15 includes N input lines 251 and M output lines 252, which lines are interconnected at cross-points (i.e., junctions). The cross-points accordingly define N×M cells 254, also called unit cells. The input and output lines are interconnected through memory systems 256. In principle, at least two input lines and two output lines are needed to define an array (i.e., N≥2 and M≥2). In practice, however, the number of input lines 251 and output lines 252 will typically be on the order of several hundreds to thousands of lines. For example, arrays of 256×256, 512×512, or 1024×1024 may be contemplated, although N need not be necessarily equal to M. The IMC device 15 may for instance be meant to be used as a neural processing apparatus, designed to implement M neurons at a time. The number of neurons may thus be equal to 256, 512, or 1024, for example. Vectors are encoded in signals, which are applied to the input lines of the crossbar array via the input unit 27.

As schematically shown in FIG. 6, the cross-points include respective memory systems 256. Each memory system 256 includes a group of K memory elements 257 where K≥1. That is, each cell 254 includes K memory elements. In variants, each cell includes K≥2 memory elements, which can be arranged in parallel in each group. In particular, each cell may contain two groups of K memory elements 257 each. Various connection schemes can be contemplated. In embodiments, each input (respectively output) line typically subdivides into K or 2 K conductors, so as to adequately connect to (respectively from) respective memory elements of each cell. So, each input (or output) line typically includes several, parallel electrical conductors.

Each of the K memory elements includes a PCM device 10 as described herein. Moreover, the control system 26-29 includes a programming unit 29, see FIG. 6, which is connected to the crossbar array structure 25. The programming unit 29 is configured to program each cell 254 in accordance with a given a target conductance value, i.e., a value corresponding to a target weight value to be stored in each cell. Programming a cell means storing a target weight value in this cell. The target weight value can be converted in an electrical conductance value. So, the aim is to program memory elements of this cell for them to yield a summed conductance value matching a target conductance value corresponding to the target weight value to be stored in that cell.

In operation, the programming unit 29 is used to adjust conductance values of the memory elements 257 by applying suitable voltage signals across the input lines or the output lines of the IMC device 15. In variants, the programming unit 29 may connect to the memory elements through independent connectors. In addition, the processing system 1 typically includes a readout circuit 26 connected in output of the output lines 252. The programming unit 29 may thus be connected to the readout circuit 26, in output thereof, so as to be able to adjust conductance values of the memory elements 257, e.g., in accordance with a single-device programming method. Moreover, the system 1 may further include a processing unit 28, connected in output of the crossbar array 25 (i.e., in output of the readout circuitry 26).

This processing unit 28 may be arranged as a near-memory processing unit, as assumed in FIG. 6. In that case, the programming unit 29 may advantageously be connected in output of the near-memory processing unit 28, to allow a closed-loop programming of the crossbar array structure 25. In variants, the processing unit 28 and the programming unit 29 are implemented as one and a same unit. The programming unit 29 may further include an input/output (I/O) controller and be configured to communicate with external devices or computers, as suggested in FIG. 6.

Figure 7:
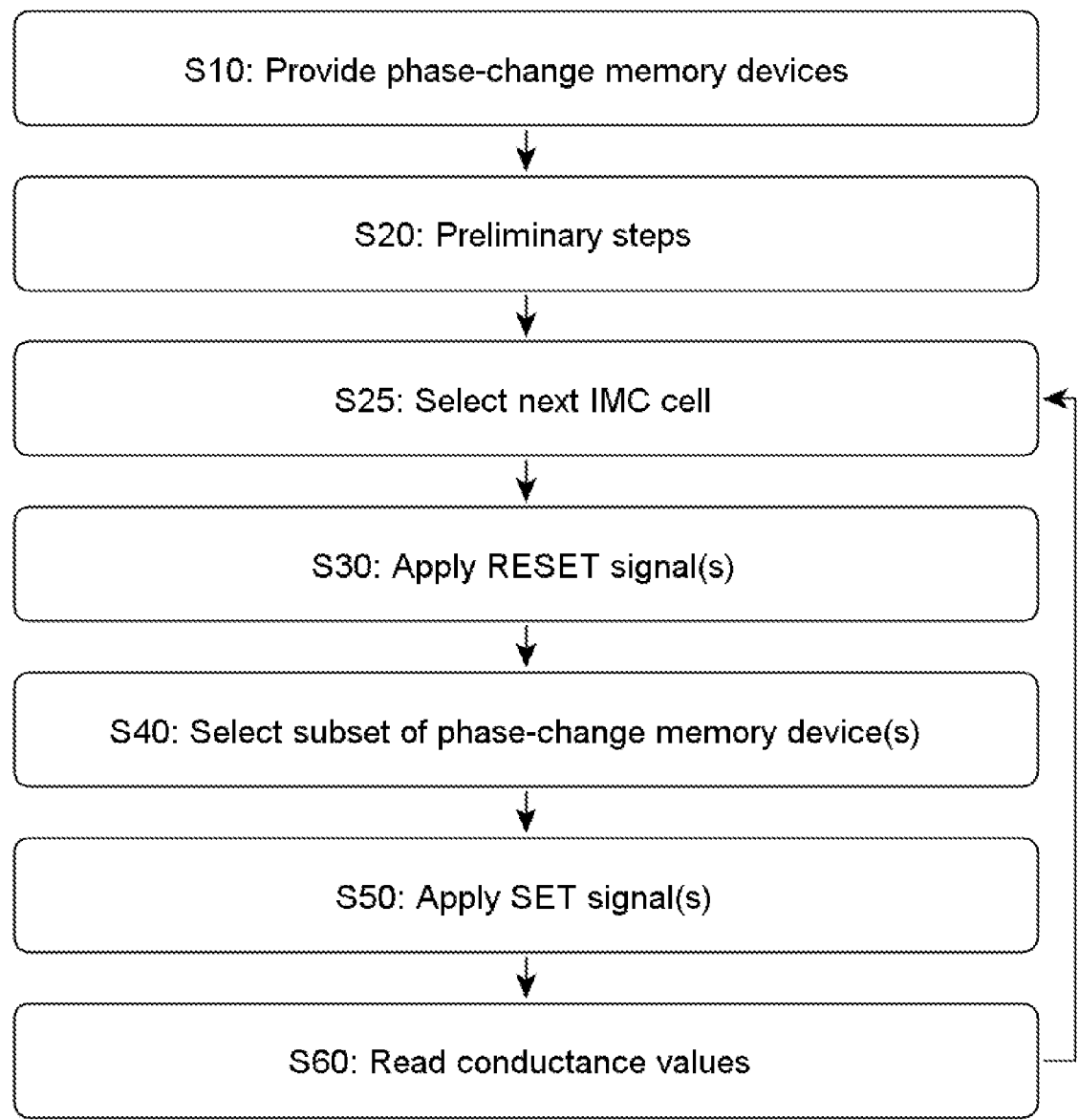
FIG. 7 is a flowchart illustrating high-level steps of a method of operating a PCM device, according to embodiments.

Next, according to a further aspect, the invention can be embodied as a method of operating one or more PCM devices 10 as disclosed herein. Such PCM devices may notably form part of a data processing system 1 as described above. As seen in FIG. 7, the method revolves around repeatedly applying (steps S30 and S50) current pulses through the heater 15 of each PCM device, so as to bring each PCM device to a high- or low-resistance state. That is, a RESET current pulse is applied S30 to the heater 15 of a given device 10 to grow an annular amorphous region in the corresponding PCM layer 14 from the heater 15. This brings the PCM layer 14 to a high-resistance state. A SET current pulse S50 can then be applied to decrease the annular amorphous region in the PCM layer 14 and accordingly bring the PCM layer 14 to a low-resistance state.

In practice, steps S30 and S50 may typically be interleaved with other steps, as suggested by FIG. 7. Such operations may for example aim at programming memory elements of an IMC device 25 as described above. PCM devices 10 are first provided at step S10, as part of the IMC device. Next, preliminary steps are taken S20, e.g., to suitably initialize or prepare the PCM devices. An iterative process subsequently starts at step S25, whereby a next IMC cell 254 is selected. At step S30, a RESET signal is applied to all memory elements of the currently selected cell. Next, at step S40, a subset of memory elements of this cell is selected in accordance with the target weight value to be stored in that cell. A SET signal is then applied S50 to all the memory elements selected, prior to reading S60 conductance values of the memory elements of the cell at step S60. The process then moves on to the next cell S25. This process repeats until all cells are suitably programmed.

A final aspect of the invention is now described in reference to FIGS. 5A-5I. This aspect concerns a method of fabrication of a PCM device 10*a* as described earlier. Essentially, the fabrication method aims at fabricating a PCM cell 12-16 and embedding the PCM cell obtained in an electrically insulating material 11*c*.

To fabricate the PCM cell 12-16, a stack of layers is first obtained, using any suitably layer deposition process, see FIG. 5A. In embodiments, however, use is made of a PVD process, which is compatible with layer thicknesses as contemplated herein. The material layers in the stack depend on the PCM cell design option chosen and may depend on the fabrication process used, too. In all cases, the stack includes a PCM layer 14, e.g., a 2-4 nm thick layer of GST. In addition, the layer stack may typically include additional layers, such as an electrically insulating material layer 11*s* (e.g., a dielectric layer including $SiO_2$, serving as a substrate to grow or deposit additional layers), and a further insulating layer 11*a* (e.g., an 8 nm thick dielectric layer of $SiO_2$), on top of the PCM layer 14. Moreover, the layer stack may further include a resistive projection liner 13*a*, e.g., a 2-5 nm thick layer of TiN, as in certain embodiments. The liner 13*a* coats (i.e., contacts) the PCM layer 14 on its top surface in the example of FIGS. 5A-5I, contrary to the example of FIG. 1. The top surface and the bottom surface of the PCM layer 14 are linked by its side surface; the PCM layer may roughly have a cylindrical or rhombohedral shape, as noted earlier.

The layer stack may then be subjected to various processing steps, for example to form a sidewall spacer 16, using a mask 16*m*, as shown in FIG. 5B. A via is subsequently opened from the top surface of the stack, transversely to the average plane of the PCM layer 14. In the example of FIGS. 5B and 5C, the via 15*v* is etched through the spacer 16 (FIG. 5B) and then through the liner 13*a*, so as to partially penetrate into the dielectric layer (FIG. 5C). I.e., the via 15*v* does not fully extend through the PCM layer in this example. In variants, the via may fully extend through the PCM layer, and even protrude from it, as noted earlier in reference to FIG. 1.

The via 15*v* is subsequently filled (FIG. 5D) with a heating material such as tungsten, TiN, or another metal nitride, to obtain a heater 15. By design, the heater 15 contacts the PCM layer 14, as well as all other layers of the stack. The mask 16*m* may subsequently be removed. The pattern transfer may result in a tapered or pyramidal shape of the layer stack, see FIG. 5E, something that will favor the adhesion of the outer electrode to be deposited next.

As seen in FIG. 5F, the outer electrode layer 12*a* is deposited on the layer stack, so as to contact the side surface of the layer stack (including the side surface of the PCM layer 14) and the top surface of the layer stack. A via is subsequently opened on top, see FIG. 5G, yielding an outer electrode 12 with a peripheral rim on top of the spacer layer, prior to capping the layer stack 12, 13*a*, 11*a*, 14-16 by an electrically insulating material 11*c*, to embed the PCM cell, see FIG. 5H. Another via can then be open on top to deposit and pattern a further layer, to form a top electrode 17 and a further element 18, e.g., an electrical conductor (as part of a selector), or a resistance, see FIG. 5I. A further via may then be etched through the electrically insulating embedding material, and filled, to obtain an electrical contact pad (not shown in FIGS. 5I, see FIG. 1), which contacts the outer electrode 12.

The fabrication process shown in FIGS. 5A-5I involves a self-alignment deposition method, thanks to which the heater self-aligns with the layer stack. In prior approaches, due to the inevitable overlay error or misalignment between the patterned heater and the phase-change material layer, the heater is not always located at the center of the PCM cell. E.g., the heater and the PCM cell may not be perfectly concentric. Now, this misalignment may notably result in a non-uniform distribution of the programming current, which can result in degraded (and sometimes unpredictable) performance of the PCM device. Moreover, this conventional integration process introduces cell-to-cell variability in the PCM device.

Therefore, use is advantageously made of a self-alignment process, where a hard mask 16*m* is formed on top of the layer stack (FIG. 5B). The hard mask 16*m* has an opening that exposes a portion of the top dielectric layer 11*a* (not shown); the inner spacer 16 is formed in this opening, prior to open the via 15*v*, see FIG. 5B. The via 15*v* is then extended down to the PCM layer 14 (see FIG. 5C), prior to filling the extended via with a heating element. By forming the heating element 15 in the extended via obtained from the inner spacer 16, the heating element 15 is at a substantially identical distance to the outer edge or sidewall of the layer stack. The spacer 16 eventually serves as a protection layer.

The fabrication process shown in FIGS. 5A-5I first requires etching the via 15*v* (to obtain the heater 15) and then deposit the outer electrode layer 12*a*. In variants, however, the outer electrode layer may be deposited prior to opening the via and filling the via with a heating material. For example, once the layer stack has been patterned, it can be capped with a layer forming an outer electrode, prior to opening a via from the top surface of a protection layer (e.g., HSQ) of the stack and filling the via to form the heater (not shown). Before depositing the outer electrode, the sidewalls of the PCM layer can be advantageously cleaned using an inverse sputter etch process to ensure an ohmic contact between the outer electrode and the PCM layer. So, as one understands, the outer electrode layer may be deposited prior to or after obtaining the heater.

As illustrated above, various fabrication processes can be contemplated, which allow shallow structures to be obtained. The PCM layer 14 can be made ultra-thin (e.g., less than 10 nm). Similarly, other layers 13, 11*a*, 16 can be made thin or ultra-thin. All the more, the outer electrode configuration makes it possible to reduce the thickness of the whole layer stack, which may be less than, e.g., 70 nm (as assumed in FIG. 1), or even less than 40 nm in some embodiments. In principle, though, the whole layer stack may reach 100 nm or more. The various layers can be deposited using a PVD process. So, there is no need to rely on complex deposition processes, such as ALD or chemical vapor deposition (CVD) processes, at least not to form the layer stack of the PCM cell. Note, however, that an ALD process may still be contemplated where very small PCM layer thicknesses are desired, e.g., of less than 2 nm, as noted earlier.

Moreover, the proposed lateral design is compatible with ultra-thin heaters 15. That is, ultra-thin vias, with radii down to 5 nm, can be etched using a reactive ion etching (RIE) process or wet chemistry. The heater 15 is then be obtained by filling the via, e.g., using ALD (for diameters below 10 nm) or CVD, should the via diameters exceed 20 nm. Note, slight RIE damages can be caused to the PCM 14. However, this does not substantially impact the performance of the device, as the present inventors verified.

While the present invention has been described with reference to a limited number of embodiments, variants, and the accompanying drawings, it will be understood by those skilled in the art that various changes may be made, and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention is not limited to the particular embodiments disclosed, but that the present invention will include all embodiments falling within the scope of the appended claims. In addition, many other variants than explicitly touched above can be contemplated.

What is claimed is:

1. A phase-change memory (PCM) device comprising:
an electrically insulating material; and
a PCM cell embedded in the electrically insulating material, the PCM cell including:
a phase-change material layer having a top surface, a bottom surface, and a side surface linking the top surface and the bottom surface, an outer electrode contacting the side surface of the phase-change material layer, wherein the outer electrode extends vertically along the side surface of the phase-change material layer, and a heater extending at least partially through the phase-change material layer, transversely to the top surface and the bottom surface of the phase-change material layer, thereby contacting the phase-change material layer.

2. The PCM device according to claim 1, wherein the heater extends fully through the phase-change material layer.

3. The PCM device according to claim 1, wherein the heater extends only partially through the phase-change material layer.

4. The PCM device according to claim 1, wherein the outer electrode fully caps, laterally, the side surface of the phase-change material layer.

5. The PCM device according to claim 2, wherein the heater extends perpendicularly to each of the top surface and the bottom surface of the phase-change material layer, and a longitudinal axis of the heater passes through a center of the phase-change material layer.

6. The PCM device according to claim 1, wherein an average thickness of the phase-change material layer is smaller than an average diameter of a portion of the heater that extends through the phase-change material layer.

7. The PCM device according to claim 6, wherein the average diameter of said portion is between 5 nm and 100 nm.

8. The PCM device according to claim 7, wherein the average diameter of said portion is between 30 nm and 40 nm, while the average thickness of the phase-change material layer is between 1 nm and 20 nm.

9. The PCM device according to claim 1, wherein an average diameter of said top surface and said bottom surface is between 45 nm and 500 nm.

10. The PCM device according to claim 1, wherein the PCM cell further includes a resistive projection liner contacting the phase-change material layer on one of said top surface and said bottom surface;

the outer electrode fully caps, laterally, the side surface of the phase-change material layer and a side surface of the resistive projection liner; and the heater extends through, and thereby contacts, each of the phase-change material layer and the resistive projection liner.

11. The PCM device according to claim 10, wherein the resistive projection liner includes one of C, TiN, and TaN.

12. The PCM device according to claim 1, wherein the PCM cell further includes an electrically insulating material layer and a protection layer on top of the electrically insulating material layer, the electrically insulating material layer sandwiched between the protection layer and the top surface of the phase-change material layer, the outer electrode fully caps, laterally, the side surface of the phase-change material layer, as well as side surfaces of the protection layer and said electrically insulating material layer, and the heater extends through, and thereby contacts, each of the protection layer, the electrically insulating material layer, and the phase-change material layer.

13. The PCM device according to claim 12, wherein the outer electrode is structured to cap only a peripheral area of the top surface of the protection layer.

14. The PCM device according to claim 12, wherein the protection layer includes hydrogen silsesquioxane.

15. The PCM device according to claim 1, wherein the phase-change material layer includes a germanium-antimony-tellurium alloy.

16. The PCM device according to claim 1, wherein the PCM device further includes a heater electrode contacting said heater and a circuit component contacting said heater electrode, said circuit component being one of a resistance and a selector, and the heater electrode and said circuit component extend on one side of the phase-change material layer and are embedded in said electrically insulating material.

17. The PCM device according to claim 16, wherein the PCM device further includes two electrical contact pads, which respectively fill two vias extending through the electrically insulating material to respectively contact said circuit component and the outer electrode.

18. A data processing system comprising:

a control system; and one or more phase-change memory (PCM) devices, wherein each device of the one or more PCM devices is connected to the control system and comprises a PCM cell embedded in an electrically insulating material, wherein the PCM cell includes:

a phase-change material layer having a top surface, a bottom surface, and a side surface linking the top surface and the bottom surface;

an outer electrode contacting the side surface of the phase-change material layer, wherein the outer electrode extends vertically along the side surface of the phase-change material layer; and a heater extending at least partially through the phase-change material layer, transversely to the top surface and the bottom surface of the phase-change material layer, thereby contacting the phase-change material layer.

19. The data processing system according to claim 18, wherein the data processing system comprises an in-memory computing device, which has a crossbar array structure including N input lines and M output lines interconnected at cross-points defining N×M cells, where N≥2 and M≥2, wherein the cross-points include respective memory systems, each including a group of K memory elements, where K≥1, whereby each cell of the N×M cells includes K memory elements, wherein each of the K memory elements includes one of the PCM devices, and said control system comprises a programming unit connected to the crossbar array structure, the programming unit configured to program each cell in accordance with a given a target conductance value corresponding to a target weight value to be stored in said each cell.

20. A method of operating a phase-change memory (PCM) device, the method comprising:

providing a PCM device comprising a PCM cell embedded in an electrically insulating material, wherein the PCM cell includes:

a phase-change material layer having a top surface, a bottom surface, and a side surface linking the top surface and the bottom surface;

an outer electrode contacting the side surface of the phase-change material layer, wherein the outer electrode extends vertically along the side surface of the phase-change material layer; and a heater extending at least partially through the phase-change material layer, transversely to the top surface and the bottom surface of the phase-change material layer, so as to contact the phase-change material layer, and repeatedly applying, through the heater, a RESET current pulse to grow an annular amorphous region in the phase-change material layer from the heater and accordingly bring the phase-change material layer to a high-resistance state, and a SET current pulse to decrease the annular amorphous region in the phase-change material layer and accordingly bring the phase-change material layer to a low-resistance state.

21. A phase-change memory (PCM) device comprising:

an electrically insulating material; and a PCM cell embedded in the electrically insulating material, the PCM cell including:

a phase-change material layer having a top surface, a bottom surface, and a side surface linking the top surface and the bottom surface, a PCM electrically insulating material layer located on top of phase-change material layer, a protection layer on top of the PCM electrically insulating material layer, an outer electrode contacting the side surface of the phase-change material layer, wherein the outer electrode extends vertically along the side surface of the phase-change material layer; and a heater extending at least partially through the phase-change material layer, transversely to the top surface and the bottom surface of the phase-change material layer, thereby contacting the phase-change material layer.

22. The PCM device according to claim 21, wherein the electrically insulating material layer sandwiched between the protection layer and the top surface of the phase-change material layer, wherein the outer electrode fully caps, laterally, the side surface of the phase-change material layer, as well as side surfaces of the protection layer and said electrically insulating material layer, and wherein the heater extends through, and thereby contacts, each of the protection layer, the electrically insulating material layer, and the phase-change material layer.

23. The PCM device according to claim 22, wherein the outer electrode is structured to cap only a peripheral area of the top surface of the protection layer.

24. The PCM device according to claim 22, wherein the protection layer includes hydrogen silsesquioxane.

* * * * *